US011837307B2

(12) United States Patent
Muchherla et al.

(10) Patent No.: US 11,837,307 B2
(45) Date of Patent: *Dec. 5, 2023

(54) MANAGING ERROR-HANDLING FLOWS IN MEMORY DEVICES

(71) Applicant: Micron Technology, Inc., Boise, ID (US)

(72) Inventors: Kishore Kumar Muchherla, San Jose, CA (US); Shane Nowell, Boise, ID (US); Mustafa N. Kaynak, San Diego, CA (US); Sampath K. Ratnam, San Jose, CA (US); Peter Feeley, Boise, ID (US); Sivagnanam Parthasarathy, Carlsbad, CA (US); Devin M. Batutis, San Jose, CA (US); Xiangang Luo, Fremont, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/979,432

(22) Filed: Nov. 2, 2022

(65) Prior Publication Data
US 2023/0046724 A1 Feb. 16, 2023

Related U.S. Application Data

(63) Continuation of application No. 17/205,091, filed on Mar. 18, 2021, now Pat. No. 11,532,373.

(51) Int. Cl.
*G11C 29/42* (2006.01)
*G11C 16/26* (2006.01)
(Continued)

(52) U.S. Cl.
CPC ............ *G11C 29/42* (2013.01); *G11C 16/102* (2013.01); *G11C 16/26* (2013.01); *G11C 29/12005* (2013.01); *G11C 29/44* (2013.01)

(58) Field of Classification Search
CPC ....... G11C 29/42; G11C 16/102; G11C 16/26; G11C 29/12005; G11C 29/44;
(Continued)

(56) References Cited

U.S. PATENT DOCUMENTS 11,175,979 B2 11/2021 Rayaprolu
11,314,425 B2 4/2022 Luo
(Continued)

FOREIGN PATENT DOCUMENTS

CN 111863097 A 10/2020
EP 3503107 A1 6/2019

*Primary Examiner* — Sultana Begum
(74) *Attorney, Agent, or Firm* — Lowenstein Sandler LLP

(57) ABSTRACT

Systems and methods are disclosed including a memory device and a processing device operatively coupled to the memory device. The processing device can perform operations including performing, on data residing in a block of the memory device, an error-handling operation of a plurality of error-handling operations, wherein an order of the plurality of error-handling operations is based on a voltage offset bin associated with the block, wherein the voltage offset bin defines a set of threshold voltage offsets to be applied to a base voltage read level during read operations; and responsive to determining that the error-handling operation has failed to recover the data, adjusting the order of the plurality of error-handling operations.

20 Claims, 6 Drawing Sheets

| ERROR-HANDLING METADATA TABLE 410 | | | ERROR-HANDLING METADATA TABLE 420 | | | | | | |
|---|---|---|---|---|---|---|---|---|---|
| Bin | Error Handling Flow | | Error Handling Flow | Order of Operations | OP1 Parameters | OP2 Parameters | OP3 Parameters | OP1 Success Rate | OP2 Success Rate | CP3 Success Rate |
| 0 | $F_0$ | | $F_0$ | OP1, OP2, OP3 | $P_{F0-OP1}$ | $P_{F0-OP2}$ | $P_{F0-OP2}$ | $SR_{F0-OP1}$ | $SR_{F0-OF2}$ | $SR_{F0-OP3}$ |
| 1 | $F_1$ | | $F_1$ | OP2, OP1, OP3 | $P_{F1-OP1}$ | $P_{F1-OP2}$ | $P_{F1-OP2}$ | $SR_{F1-OP1}$ | $SR_{F1-OF2}$ | $SR_{F1-OP3}$ |
| 2 | $F_2$ | | $F_2$ | OP2, OP1, OP3 | ... | ... | ... | ... | ... | ... |
| 3 | $F_3$ | | $F_3$ | OP2, OP3, OP1 | ... | ... | ... | ... | ... | ... |
| 4 | $F_4$ | | $F_4$ | OP3, OP1, OP2 | | | | | | |
| 5 | $F_5$ | | $F_5$ | OP3, OP2, OP1 | $P_{F5-OP1}$ | $P_{F5-OP2}$ | $P_{F5-OP2}$ | $SR_{F5-OP1}$ | $SR_{F5-OP21}$ | $SR_{F5-OP3}$ |
| ... | ... | | ... | ... | ... | ... | ... | ... | ... | ... |

500

DETECT A READ ERROR WITH RESPECT TO DATA RESIDING IN A BLOCK OF THE MEMORY DEVICE
510

DETERMINE AN ORDER OF A PLURALITY OF ERROR-HANDLING OPERATIONS TO BE PERFORMED TO RECOVERY DATA ASSOCIATED WITH THE READ ERROR
520

PERFORM AT LEAST ONE ERROR-HANDLING OPERATION FROM THE ERROR-HANDLING OPERATIONS ASSOCIATED WITH THE ERROR-HANDLING FLOW
530

PERFORM AN ADJUSTMENT TO THE ERROR-HANDLING FLOW
540

(51) Int. Cl.
*G11C 29/44* (2006.01)
*G11C 16/10* (2006.01)
*G11C 29/12* (2006.01)

(58) Field of Classification Search
CPC ........ G11C 29/4401; G11C 2029/0411; G11C 11/5642; G11C 29/021; G11C 29/028; G11C 29/52; G11C 16/0483; G11C 2029/0409; G11C 16/349; G11C 16/10; G11C 16/30; G11C 16/34; G06F 11/0727; G06F 11/0793; G06F 13/1668
See application file for complete search history.

(56) References Cited

U.S. PATENT DOCUMENTS

| | | | |
|---|---|---|---|
| 2018/0189135 A1* | 7/2018 | Naik | G11C 29/028 |
| 2019/0107972 A1 | 4/2019 | Lee | |
| 2019/0278653 A1 | 9/2019 | Padilla, Jr. | |
| 2021/0255781 A1* | 8/2021 | Chae | G06F 3/0613 |
| 2021/0304837 A1 | 9/2021 | Kim | |

* cited by examiner

| ERROR-HANDLING METADATA TABLE 410 | |
|---|---|
| Bin | Error Handling Flow |
| 0 | $F_0$ |
| 1 | $F_1$ |
| 2 | $F_2$ |
| 3 | $F_3$ |
| 4 | $F_4$ |
| 5 | $F_5$ |
| ⋮ | ⋮ |

ERROR-HANDLING METADATA TABLE 420

| Error Handling Flow | Order of Operations | OP1 Parameters | OP2 Parameters | OP3 Parameters | OP1 Success Rate | OP2 Success Rate | OP3 Success Rate |
|---|---|---|---|---|---|---|---|
| $F_0$ | OP1, OP2, OP3 | $P_{F0-OP1}$ | $P_{F0-OP2}$ | $P_{F0-OP2}$ | $SR_{F0-OP1}$ | $SR_{F0-OP2}$ | $SR_{F0-OP3}$ |
| $F_1$ | OP2, OP1, OP3 | $P_{F1-OP1}$ | $P_{F1-OP2}$ | $P_{F1-OP2}$ | $SR_{F1-OP1}$ | $SR_{F1-OP2}$ | $SR_{F1-OP3}$ |
| $F_2$ | OP2, OP1, OP3 | ⋮ | ⋮ | ⋮ | ⋮ | ⋮ | ⋮ |
| $F_3$ | OP2, OP3, OP1 | ⋮ | ⋮ | ⋮ | ⋮ | ⋮ | ⋮ |
| $F_4$ | OP3, OP1, OP2 | ⋮ | ⋮ | ⋮ | ⋮ | ⋮ | ⋮ |
| $F_5$ | OP3, OP2, OP1 | $P_{F5-OP1}$ | $P_{F5-OP2}$ | $P_{F5-OP2}$ | $SR_{F5-OP1}$ | $SR_{F5-OP21}$ | $SR_{F5-OP3}$ |
| ⋮ | | | | | | | |

FIG. 4

MANAGING ERROR-HANDLING FLOWS IN MEMORY DEVICES

RELATED APPLICATION

This application a continuation of U.S. patent application Ser. No. 17/205,091, filed Mar. 18, 2021, the entire contents of which is hereby incorporated by reference herein.

TECHNICAL FIELD

Embodiments of the disclosure relate generally to memory sub-systems, and more specifically, relate to the managing error-handling flows in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 4 illustrates example metadata maintained by the memory sub-system controller, in accordance with aspects of the present disclosure.

DETAILED DESCRIPTION

Figure 1:
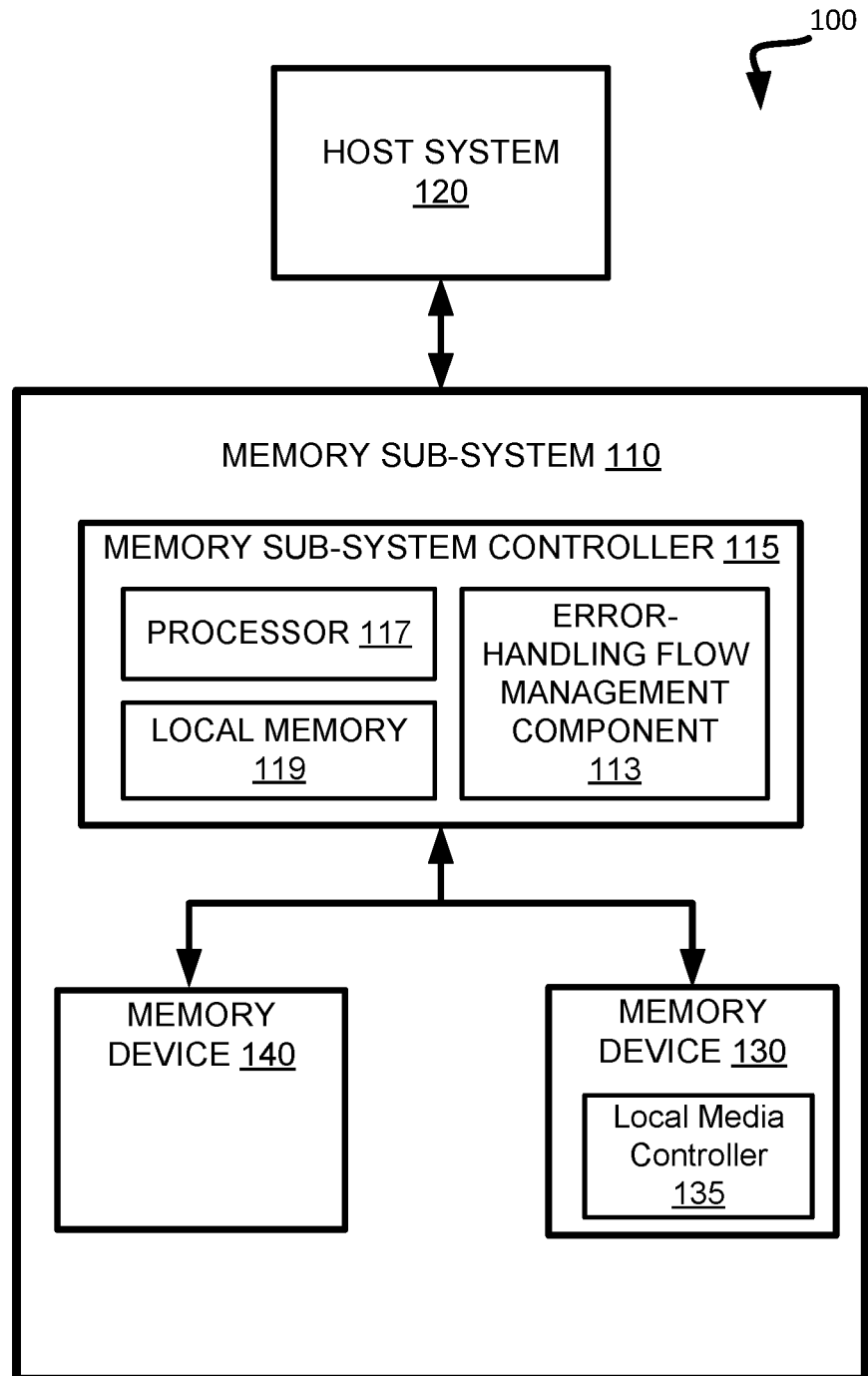
FIG. 1 illustrates an example computing system that includes a memory sub-system in accordance with some embodiments of the present disclosure.

Aspects of the present disclosure are directed to managing error-handling flows in memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a negative-and (NAND) memory device. Other examples of non-volatile memory devices are described below in conjunction with FIG. 1. Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

Various data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error-handling data (e.g., error correction code (ECC) codeword parity data), data version (e.g. used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell, which is called as the "threshold voltage" and denoted as Vt.

A high-quality memory device can have distributions that are narrow compared with the working range of control voltages tolerated by the cells of the device. Accordingly, multiple distributions (with "valleys" between distributions) can be fit into the working voltage window allowing storing and reliably detecting multiple bits per cell such as $2^3=8$ distributions (7 valleys) for TLC, $2^2=4$ distributions (3 valleys) for MLC etc. The distributions are interspersed with voltage intervals ("valley margins") between distributions where none (or very few) of the memory cells of the device have their threshold voltages. Therefore, such valley margins can be used to separate various charge states—the logical state of the cell can be determined by detecting, during a read operation by applying read voltages corresponding to each valley. This effectively allows a single memory cell to store multiple bits of information: a memory cell operated with $2^N$ distributions (which are also called levels) is capable of storing N bits of information. During the read operation, $2^N$-1 read voltages are applied to distinguish $2^N$ distributions. Specifically, the read operation can be performed by comparing the measured threshold voltage $V_T$ exhibited by the memory cell to one or more reference voltage levels corresponding to known valleys (e.g., centers of the valleys) of the memory device.

Due to the phenomenon known as slow charge loss (SCL), the threshold voltage $V_T$ of a memory cell can change with time as the electric charge of the cell is diminishing, the process sometimes referred to as "temporal voltage shift" (TVS). "Storage charge loss" and "system charge loss" naming is also used for SCL. Since typical cells store negatively charged particles (electrons), the loss of electrons causes the voltage thresholds to shift along the voltage axis towards lower voltage thresholds $V_T$. The threshold voltages can change rapidly at first (immediately after the memory cell is programmed) while slowing down at larger times in an approximately log-linear or power-law fashion ($\Delta V_T(t)=-C^*t^b$) with respect to the time t elapsed since the cell programming event. In some embodiments of the present disclosure, TVS can be mitigated by keeping track of the time elapsed since the programming event as well as of the environmental conditions of a particular memory partition (block, plane, etc.) such as temperature and associating a voltage offset $\Delta V_T$ per valley to be used during read operations, where the standard "base read level" threshold voltage $V_T$ (displayed by the cell immediately after programing) is modified by the voltage offset: $V_T \rightarrow V_T + \Delta V_T$ where $\Delta VT$ is negative due to charge loss. Whereas TVS is a continuous process and the compensating for $\Delta V_T(t)$ can be a continuous function of time, adequate accuracy of offsets can be achieved in some embodiments with a discrete number of offset "bins." Blocks can be associated with a bin using metadata (e.g., programmed within a specified time window and under similar environmental (e.g., temperature) conditions). Since the time elapsed since programming and temperature conditions are among the main factors affecting the amount of TVS, blocks associated with the same bin can be presumed to exhibit similar distributions of threshold voltages of their memory cells, and thus would require the same voltage offsets to be applied to the base read levels for read operations The memory sub-system controller can periodically perform a calibration process in order to associate blocks with one of the bins. Each bin, in turn, can be associated with a set of the voltage offsets to be applied for read operations. The associations of blocks with bins is referred herein as auxiliary read metadata (ARM), which represent a part of broader state metrics of the memory device. The state metrics can also reflect the number of retired physical memory blocks (or other partitions), the number of times various physical blocks have been erased, types of configurations of cells of various memory partitions (e.g., single-level cell vs. multi-level cells), or any other type of information representative of the state of the memory device. The ARM can be stored in metadata tables maintained by the memory sub-system controller.

In accordance with embodiments of the present disclosure, the TVS can be selectively tracked for programmed partitions that are grouped into families. Based on the groupings of partitions into families, appropriate bin-specific read (voltage) offsets are applied to the base read (voltage) levels in read operations. Base read levels can also be stored in the metadata of the memory device. Upon receiving a read command, the memory sub-system controller can identify the family associated with the memory partition identified by the logical address specified in the read command, identify the current bin associated with the identified family, determine a set of read offsets for the identified bin, compute the new read voltages by additively applying the read offsets associated with the identified bin to the base read levels, and perform the read operation using the new read voltage, as described in more detail below.

"Read error" refers to a memory sub-system's failure to validate one or more data items that have been retrieved from a memory device in response to a read command. Read errors can be associated with host-initiated read operations or system-initiated scanning operations and can occur due to, for example, the measured threshold voltage $V_T$ exhibited by the memory cell mismatching with the read voltage levels due to TVS, the requested data being subjected to noise or interference, etc. In a read error, the bit errors in the read data is greater than what the underlying ECC can correct and this results in an ECC failure and accordingly read error. In response to a read error, the memory sub-system can perform an error-handling flow in an attempt to recover the data. The error-handling flow can include one or more error-handling operations with respect to the data items that have been retrieved from the memory device. An error handling operation can include one or more read retries using different parameters, such as a change in read voltage, as compared to the initial read operation performed on the memory cell. The error-handling operation can also include "deep error handling techniques," such as forward error correction (FEC) with various versions of reliability information, hybrid automatic repeat request (HARQ), etc.

In some implementations, the memory sub-system controller can use a default (e.g., static) error-handling flow in which the order of the error-handling operations performed during an error-handling flow remains the same for all blocks of the memory device. For example, upon entering the error-handling flow, the memory sub-system controller can first perform a set of relatively low latency steps, such as a predetermined amount read retries using varying, relatively small (e.g., not exceeding a predefined threshold) read offsets applied to the base read level. Responsive to the low latency steps successfully recovering the data, the memory sub-system controller can exit the error-handing flow to resume read and write operations. Responsive to the low latency steps failing to recover the data, the memory sub-system controller can perform the next error-handling operations specified in the error-handling flow. For example, the memory sub-system controller can perform higher latency steps, such as applying larger read offsets as compared to the read offsets used in the low latency steps, or using deep error-handling techniques (e.g., FEC, HARQ, etc.) to recover the data.

However, error-handling operations can be time consuming and impact performance of the memory sub-system. The error-handling operations can result in increased read times and/or degraded performance as observed by the host system. The more frequently one or more error-handling operations are triggered, the slower the performance of the memory system as fewer read operations and write operations can be performed. Also, the particular location of memory sub-system that enters error-handling flow is blocked from taking other commands from the host, resulting in reduced availability of the memory sub-system to perform other read operations or write operations.

Aspects of the present disclosure improve the efficiency of error-handling operations by implementing a memory sub-system controller capable of adjusting the order or error-handling operations and the parameters of error-handling operations in error-handling flows in memory devices. In particular, the memory sub-system controller can implement different error-handling flows for different bins. In one example, the associations of bins to different error handling flows can be determined during manufacturing of the memory sub-system, during programming and/or calibration of the memory sub-system, or dynamically by the memory sub-system controller. For example, the error-handling flow associated with bin 1 can instruct the memory sub-system controller to first perform error-handling operation 1, then proceed to error-handling operation 2 responsive to error-handling operation 1 failing to recover data, and last proceed to error-handling operation 3 responsive to error-handling operation 2 failing to recover data; whereas the error-handling flow associated with bin 2 can instruct the memory sub-system controller to first perform error-handling operation 2, then proceed to error-handling operation 1 responsive to error-handling operation 2 failing to recover data, and last proceed to error-handling operation 3 responsive to error-handling operation 1 failing to recover data. Each error-handling operation (e.g., error-handling operation 1, error-handling operation 2, error-handling operation 3) can include instructing the memory sub-system controller to perform one or more read retries by applying one or more read offsets to the base read, deep error-handling techniques, etc.

In other examples, the memory sub-system controller can re-order the error-handing operations of a default error-handling flow based upon the bin number associated with the block that experienced a read error. For example, the memory sub-system can be inaugurated with a default error-handling flow during the manufacturing and/or programming of the memory sub-system. Responsive to detecting a read error, the memory sub-system controller can determine which bin is associated with the block experiencing the read error, determine the order of the error-handling operations associated with the bin by using a metadata table, and perform the error-handling operations of the default error-handling flow in the order specified by the metadata data. In some embodiments, the memory sub-system controller can dynamically modify the order of the error-handling operations associated with each bin. In one example, the memory sub-system controller can maintain error-handling statistics based on read error rates (e.g., number of read commands that triggered the error-handling for a predetermined number of host reads) for each bin. In response to the read error rates satisfying a threshold criterion, the memory sub-system controller can adjust one or more of the operations in the error-handling flow. In one example, the memory sub-system controller can modify the order of the error-handling operations in the error-handling flow using the success rates of each of the error-handling operations in the error-handling flow (e.g., error-handling operations may be reordered as a function of their success rates in recovering data), and/or latency data associated with each error-handling operation in the error-handling flow. In another example, the memory sub-system controller can modify one or more error-handling operations in the error-handling flow, such as adjust the read offsets used in the error-handling operation or use a greater amount of page samples (samples of valleys of programming distributions associated with each read level threshold, which the memory sub-system controller uses for calibration operations). In some embodiments, the memory sub-system controller can implement a closed feedback loop to determine which modifications are successful in recovering data. Based on the feedback, the memory sub-system controller can update the error-handling flow for future error-handling.

Advantages of the present disclosure include, but are not limited to, an improved performance of the memory sub-system by decreasing the latency of error-handling flows performed by the memory sub-system. This can result in an improvement of performance of the memory sub-system and a decrease in power consumption by the memory sub-system. Furthermore, this can increase the lifespan of the memory sub-system. Although embodiments are described using memory cells of a NAND flash memory, aspects of the present disclosure can be applied to other types of memory sub-systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g. 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local controller 132) on the die and a controller (e.g., memory sub-system controller 115) for media management within the same memory device package. An example of a managed memory device is a managed NAND (MNAND) device.

Figure 2:
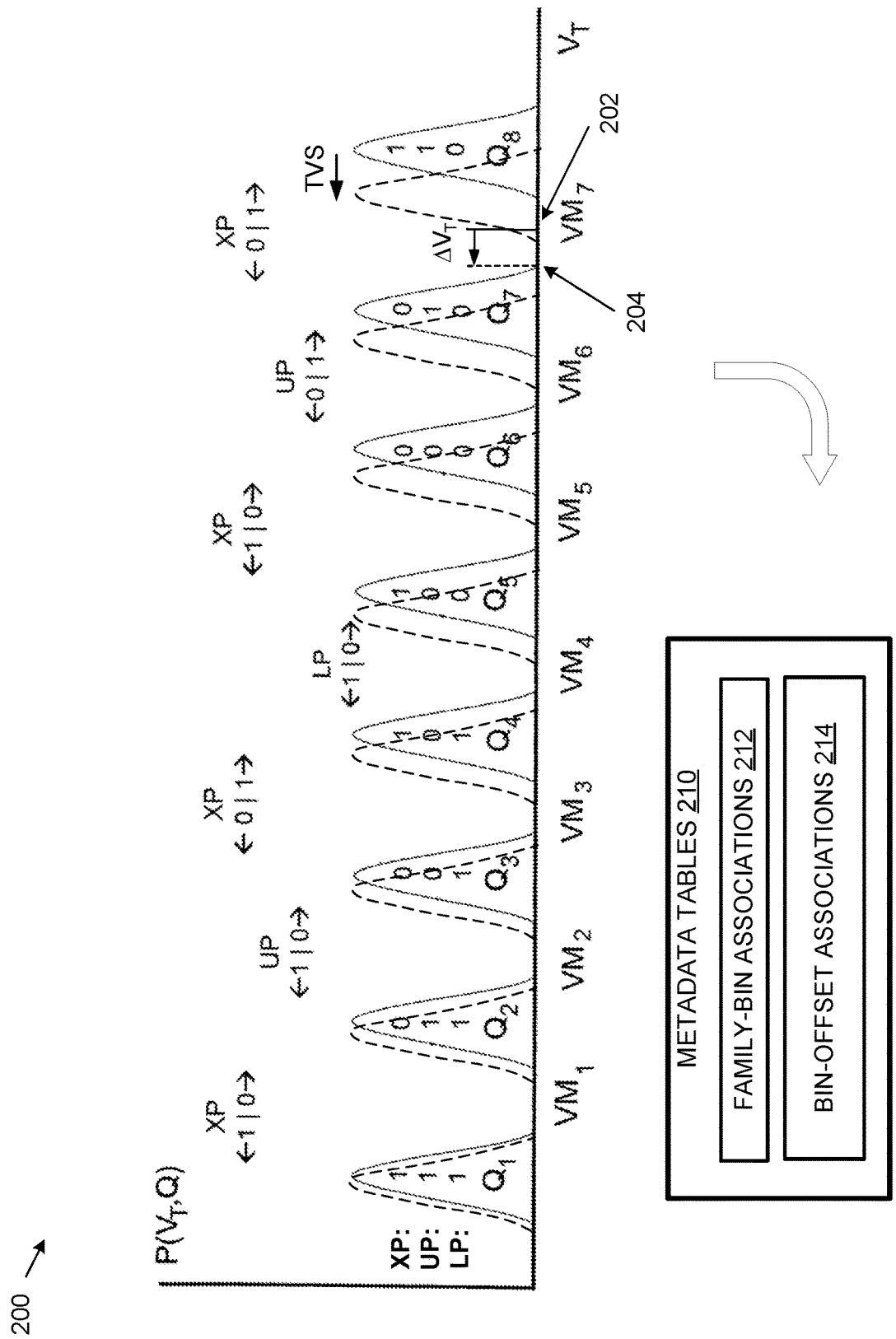
FIG. 2 illustrates schematically temporal voltage shift of a three-level memory cell capable of storing three bits of data by programming the memory cell into eight charge states that differ by the amount of charge on the cell's floating gate, in accordance with some embodiments of the present disclosure.

The memory sub-system 110 includes an error-handling flow management component 113 that can be used to implement the error avoidance strategies in accordance with embodiments of the present disclosure. In some embodiments, the memory sub-system controller 115 includes at least a portion of the error-handling flow management component 113. For example, the memory sub-system controller 115 can include a processor 117 (processing device) configured to execute instructions stored in local memory 119 for performing the operations described herein. In some embodiments, the error-handling flow management component 113 is part of the host system 120, an application, or an operating system. The error-handling flow management component 113 can manage block families associated with the memory devices 130, as described in more detail herein below FIG. 2 illustrates schematically temporal voltage shift (TVS) of a three-level memory cell (TLC) capable of storing three bits of data by programming the memory cell into eight charge states $Q_k$ (also called levels) that differ by the amount of charge on the cell's storage gate, in accordance with some embodiments of the present disclosure. The distributions of threshold voltages $P(V_T, Q_k)$ are separated with 7 valley margins $VM_n$. The cell programmed into k-th charge state ($Q_k$) can store a particular combination of 3 bits. For example, the charge state $Q_k$ can store the binary combination 101, as depicted. Other mapping of Qk to 3 bits can be used as well. This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not. A memory cell can be configured to store N=1 bits (SLC), N=2 bits (MLC), N=3 bits (TLC), N=4 bits (QLC), and so on, depending on how many distributions can be fit (and interspersed with adequate-size valley margins) within the working range of the control gate voltages. Even though FIG. 2 depicts a TLC, the operations described in the present disclosure can be applied to any N-bit memory cells.

Memory cells are typically joined by wordlines (conducting lines electrically connected to the cells' control gates) and programmed together as memory pages (e.g., 16 KB or 32 KB pages) in one setting (by selecting consecutive bitlines connected to the cells' source and drain electrodes). As an example, FIG. 2 shows a scenario where 3 bits are programmed in 3 passes. Other programming sequences such as 1-pass and 2-pass programming can be stored as well. For the example shown in FIG. 2, during a read operation, the memory controller 115 can determine that the applied control gate voltage $V_{CG}$ within the sixth valley margin $VM_6$ is not insufficient to open the cell to the source-drain electric current whereas the control gate voltage within the seventh valley margin $VM_7$ is sufficient to open the open the cell. Hence, the memory controller 115 can determine that the cell is in the charge state $Q_7$ corresponding to the logic state 010 (i.e. XP: 0, UP: 1, LP: 0).

The distributions of threshold voltages depicted with solid lines in FIG. 2 are distributions that the memory cells have immediately after programming. With the passage of time, as a result of a slow charge loss, the distributions shift (typically, towards lower values of $V_T$), as shown by the shifted valleys indicated with dashed lines. As a result, the threshold voltages of various memory cells are shifted by certain values $\Delta V_T$ that can depend on the time elapsed since programming, environmental conditions (e.g., ambient temperature), and so on. For optimal read operations, the controller 115 (or error-handling flow management component 113) can, therefore, adjust the base read levels with the corresponding offsets $V_R \rightarrow V_R + \Delta V$ (where $\Delta V$ is usually less than zero), which are the same (or approximately the same) as the temporal voltage shifts. In one embodiment, the offsets can be determined (or estimated) as the difference between the center of the valley margin (such as the center 202 of $VM_7$) immediately after programming and the center of the same—but shifted—valley margin (such as the new center 204) at some later instance of time. As depicted schematically in FIG. 2, TVS of different distributions (valleys) and valley margins can differ from each other. In a typical scenario depicted in FIG. 2, TVS is greater for larger charges Q and smaller for lesser charges.

As shown in FIG. 2, the TVS in a memory device is a continuous process. In some embodiments, however, an adequate accuracy of voltage offsets can be achieved using a discrete set of bins and, accordingly, a discrete set of voltage offsets $\Delta V$. In such embodiments, TVS phenomenon can be addressed with setting up a number of discrete bins, e.g., five, eight, twenty, etc., associated with various memory partitions. As an example, assume that for valley 7 the optimal read position is expected to shift 500 milli-volts. For the case of 6 bins, one can define offsets for valley-7 to be equally spaced such as 0 mV, 100 mV, 200 mV, 300 mV, 400 mV, 500 mV. Similarly, offsets for other valleys can be defined. Bin offsets can be defined to be not equally spaced but following a different spacing as well. The bin-related data can be stored in the metadata tables 210. The associations of various memory partitions (grouped into families, as described in more detail below) with bins can be stored in family-bin associations 212; the family-bin associations can dynamically change with the passage of time. For example, as the memory cells continue to lose charge with time, temperature and program/erase cycles (PEC), the respective memory partitions (grouped into families) can be moved, in a consecutive fashion, from junior bins to more senior bins having larger voltage offsets in magnitude. Bin-offset associations 214 can also be stored in the metadata tables 210. In some embodiments, the bin-offset associations 214 can be static whereas the family-bin associations 212 can be adjusted (based on calibration of the memory partitions) to account for the actual charge loss by the memory cells of the respective partitions. In some embodiments, family-bin associations 212 can store logical addresses of the memory partitions, such as LBA of the respective blocks, while associations of LBAs with respective physical block addresses (PBA) can be stored outside the metadata tables 210, e.g., in memory translations tables stored separately in the local memory 119 or one of the memory devices 130, 140. In some embodiments, however, family-bin associations 212 can additionally include LBA-to-PBA translations or store direct PBA-to-bin associations. As schematically depicted with a curved arrow in FIG. 2, the number of bins, the bin-offset associations 214, the partition-bin associations can be based upon calibration of the memory device (or similar types of memory devices, e.g., during design and manufacturing) for maximizing performance and minimizing read errors during read operations The threshold voltage offset depends on the time after program (TAP). TAP is the time since a cell has been written and is the primary driver of TVS. TAP may be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement may be made (e.g., perform reference calibration from 8 to 12 minutes after program). A time slice may be referenced by its center point (e.g., 10 minutes).

Blocks of the memory device can be grouped into block families, such that each block family includes one or more blocks that have been programmed within a specified time window and possibly a specified temperature window. As noted herein above, since the time elapsed after programming and temperature are the main factors affecting the temporal voltage shift, all blocks and/or partitions within a single block family are presumed to exhibit similar distributions of threshold voltages in memory cells, and thus would require the same voltage offsets for read operations. TVS also depends on program erase cycle, however with wear-leveling all blocks will have similar PEC and hence PEC will not be a differentiating factor of TVS among blocks within a block family.

Block families can be created asynchronously with respect to block programming events. In an illustrative example, the memory sub-system controller 115 of FIG. 1 can create ("open") a new block family whenever a specified period of time Δt (e.g., a predetermined number of minutes) has elapsed since creation of the last block family or whenever the reference temperature of memory cells, which is updated at specified time intervals, has changed by more than a specified threshold temperature ΔΘ (e.g. 10 C, 30 C, or any other value) since creation of the current block family. Similarly, the family can be "closed" (and a new family can be created) after the time Δt has elapsed since the family was created or if the reference temperature has changed (in either direction) by more than ΔΘ. The memory sub-system controller 115 can maintain an identifier of the active block family, which is associated with one or more blocks as they are being programmed A newly created block family can be associated with bin 0. Then, the memory sub-system controller can periodically perform a calibration process in order to associate each die of every block family with one of the predefines threshold voltage offset bins (bins 0-9 in the illustrative example of FIG. 3 for a single valley where as we go down on y-axis the offsets become more negative such as offset for bin-9 will have higher magnitude compared to bin-2 and both offsets will be negative), which is in turn associated with the voltage offset to be applied for read operations. The associations of blocks with block families and block families and dies with threshold voltage offset bins can be stored in respective metadata tables maintained by the memory sub-system controller.

The voltage distributions change in time due to the slow charge loss (SCL), which results in drifting values of the threshold voltage levels. In various embodiments of the present disclosure, the temporal voltage shift is selectively tracked for programmed blocks grouped by block families, and appropriate voltage offsets, which are based on block affiliation with a certain block family, are applied to the base read levels in order to perform read operations.

Figure 3:
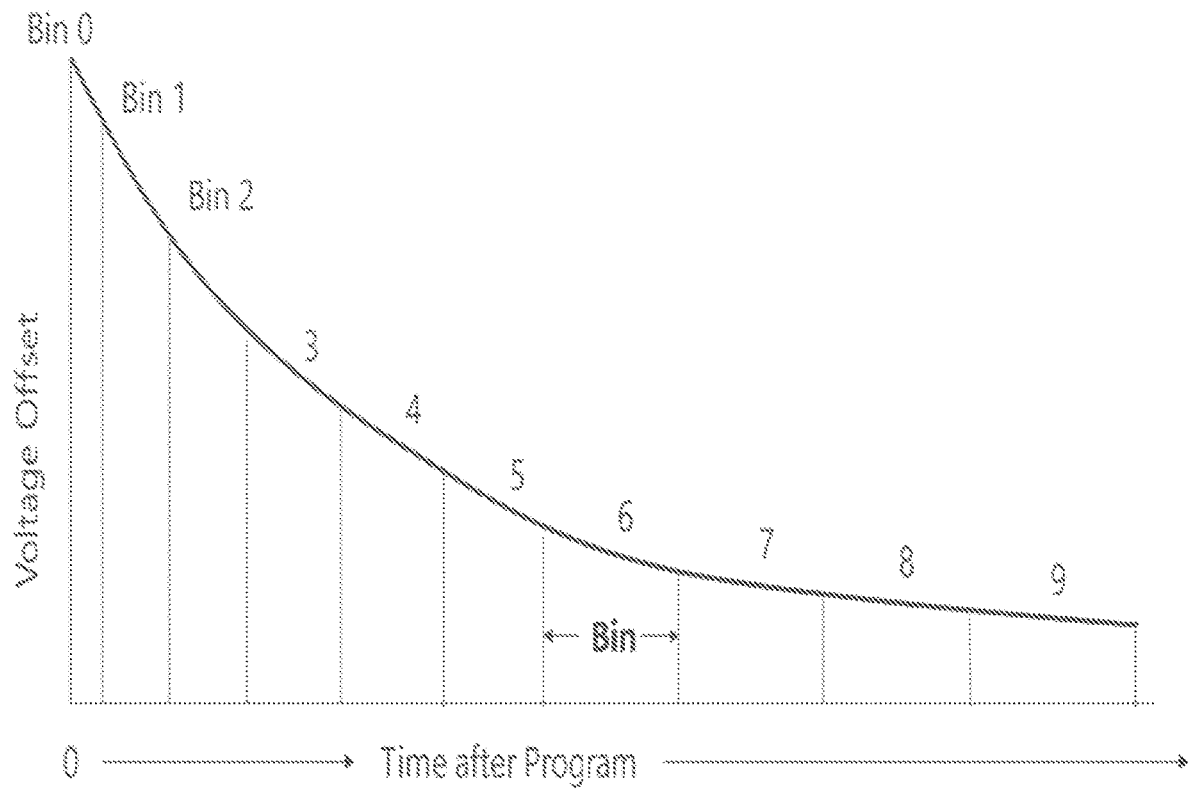
FIG. 3 depicts an example graph illustrating the dependency of the threshold voltage offset on the time after program (i.e., the period of time elapsed since the block had been programmed), in accordance with some embodiments of the present disclosure.

FIG. 3 schematically illustrates a set of predefined threshold voltage offset bins (bin 0 to bin 9) for a specific valley, in accordance with embodiments of the present disclosure. As schematically illustrated by FIG. 3, the threshold voltage offset graph 300 can be subdivided into multiple threshold voltage offset bins, such that each bin corresponds to a predetermined range of threshold voltage offsets. While the illustrative example of FIG. 3 defines ten bins (0-9), in other implementations, various other numbers of bins can be employed (e.g., 64 bins). Based on a periodically performed calibration process, the memory sub-system controller associates each die of every block family with a threshold voltage offset bin, which defines a set of threshold voltage offsets to be applied to the base voltage read level in order to perform read operations, as described in more detail herein below.

FIG. 4 schematically illustrates example metadata maintained by the memory sub-system controller, in accordance with aspects of the present disclosure. In some embodiments, error-handling flow management component 113 can maintain an error-handling metadata table 410 and error-handling metadata table 420. In some embodiments, error-handling metadata tables 410 and 420 can be stored in memory of the memory sub-system (e.g., at memory device 130, 140, local memory 119, etc.) and can be referenced by error-handling flow management component 113 to determine an error-handling flow associated with a particular offset bin.

As illustrated by error-handling metadata table 410, each bin can be associated with a respective error-handling flow (e.g., $F_0$, $F_1$ ... $F_5$). As illustrated by error-handling metadata table 420, error-handling flow can be associated a particular set of error-handling operations to be performed in a particular order (e.g., Order of Operations), parameter values (such as read level adjustment values) for each error-handling operation per error-handling flow (e.g., OP1 parameters, OP2 parameters, OP3 parameters, etc.), and the success rate of each error-handling operation per error-handling flow (e.g., OP1 success rate, OP2 success rate, OP3 success rate). Error-handling metadata tables 410 and 420 can be two separate metadata tables, or combined into a single metadata table.

The error-handling flow management component 113 can perform the error-handling operations of the error-handling flow associated with the bin to the blocks of block families associated with the same bin. In some embodiments, the associations of bins to respective error handling flows can be determined and set during manufacturing of the memory sub-system 110 or during programming and/or calibration of the memory sub-system 110. As such, each bin can be associated with an error-handling flow having a particular set of error-handling operations to be performed in a particular order.

In some embodiments, the error handling flows of each bin can be dynamically set by the memory sub-system controller 115 by re-ordering the error-handling operations of the default error-handling flow of the memory sub-system 110. The default error-handling flow can refer to an error-handling flow set for each block of the memory-subsystem during programming and/or calibration of the memory sub-system 110, and/or to the error-handling flow (e.g., $F_0$, $F_1$ ... $F_5$) initially associated with each bin. The re-ordering of the error-handling operations can be based on the success rate (e.g., $SR_{F0\text{-}OP1}$, $SR_{F0\text{-}OP2}$, $SR_{F0\text{-}Op3}$) of each error-handling operation per bin (e.g., percentage of success in recovering data exceeding a threshold criterion, percentage of successfully recovering data of each error-handling operation compared to each other, etc.). The success rate of each error-handling operation can be tracked by the error-handling flow management component 113 via metadata table 420 by maintaining a per-bin (or per error-handling flow) counter of instances of each error-handling operation successfully recovering data and a per-bin counter of instances of each error-handling operation failing to recover data.

In an illustrative example, the default error-handling flow can instruct the error-handling flow management component 113 to perform error-handling operation 1, then error-handling operation 2, and then error-handling operation 3. For blocks associated with bin 3, error-handling operation 1 can have a success rate lower than the success rates of error-handling operations 2 and 3, error-handling operation 2 can have a success rate greater than the success rates of error-handling operations 1 and 3, and error-handling operation 3 can have a success rate greater than the success rate of error-handling operation 1 but less than the success rate of error-handling operation 2. Thus, the error-handling flow management component 113 can reorder the error-handling flow for bin 3 ($F_3$) to instruct the error-handling flow management component 113 to perform, in response to a read error on a block associated with bin 3, error-handling operation 2, then error-handling operation 3, then error-handling operation 1. In some embodiments, multiple bins can be associated with the same error-handling flow.

In another illustrative example, the success rate of sequences of two or more error-handling operation can be tracked by the error-handling flow management component 113 by maintaining a per-bin counter of instances of each sequence of error-handling operations successfully recovering data and a per-bin counter of instances of each sequence of error-handling operations failing to recover data. Accordingly, the error-handling flow management component 113 can dynamically re-order the error-handling operations of the default error-handling flow based on the success rate of sequences of error-handling operation per bin (e.g., percentage of success in recovering data exceeding a threshold criterion, percentage of successfully recovering data of each error-handling operation compared to each other, etc.).

As discussed above, each error-handling flow (e.g., $F_0$, $F_1$ . . . $F_5$) can include different error-handling operations to be executed in a predetermined order by the error-handling flow management component 113 until the desired data of a read operation is successfully recovered. Error-handling operations can include one or more read retries using different parameters, such as applying different read offsets to the base read level, deep error-handling techniques such as FEC and HARQ, etc. In some embodiments, one error-handling operation can include a first set of read retries that applying a set of read offsets to the base read level, and another error-handling operation can include a second set of read retries that applying a different set (having different values) of read offsets to the base read level. One or more error-handling operations in one error-handling flow may not be included in another error-handling flow, and vice versa.

In an illustrative example, bins associated with younger blocks families (i.e., most recently created block families which experience larger TVS due to the log-linear nature of SCL where charge loss is faster right after programming vs later times) can be associated with error-handling flows where error-handling operations include relatively large read level adjustments (e.g., applying read offsets greater than a predetermined threshold value to the base read level) due the blocks in younger block families experiencing a relatively larger shift in threshold voltage (e.g., the threshold voltage changes rapidly immediately after the memory cell is programmed). As such, by executing relatively broad read level adjustments instead of relatively narrow read level adjustments (e.g., the values of the broad read level adjustments are greater than the values of the narrow read level adjustments), the error-handling flow management component 113 can increase the chance of the read level adjustment successful recovering data using the initial error-handling operation of the error-handling flow. In some embodiments, bins (e.g., relatively older bins due to having a relatively large TVS) can be assigned with an error-handling flow where the error-handling operations includes the error-handling flow management component 113 first executing deep error-handling techniques (e.g., using the hard information and soft information). In response to the deep error-handling techniques failing to recover the desired data, the error-handling flow management component 113 can then execute read level adjustment operations.

In some embodiments, the error-handling flow management component 113 can track error-handling statistics for each bin. For example, the error-handling flow management component 113 can maintain a record of read error rates, such as the number of read commands that triggered error handling per predetermined number of read commands. In response to the error-handling statistics indicating deteriorating successful read operation rates (e.g., the number of read commands that triggered error handling per predetermined number of read commands exceeding a predetermined threshold value), the error-handling flow management component 113 can perform corrective action(s) to one or more operations of the error-handling flow.

In some embodiments, the corrective actions can include the error-handling flow management component 113 calibrating the read level adjustments of one or more error-handling operations of the error-handling flow. For example, the error-handling flow management component 113 can adjust the read offsets until the data is recovered or until a predetermined number of read retries is performed.

In some embodiment, the corrective action can include the error-handling flow management component 113 increasing the number of page samples used for calibration procedures (e.g., continuous read level calibration (cRLC)). CRLC is a procedure used by the memory sub-system controller 115 to set and/or adjust read level thresholds of memory cells by using a multiple page samples to center a read level threshold between two programming distributions. By increasing the number of page samples used, the error-handling flow management component 113 can increase the accuracy of the calibration in degrading memory devices (e.g., aging memory devices, memory device subjected to heat or cold, etc.).

In some embodiments, the corrective action can include the error-handling flow management component 113 determining a proximity of the TAP (time after program) of one or more blocks of a block family (or the block family) associated with a bin, to the TAP of an adjacent bin. The error-handling flow management component 113 can then adjust the read offsets used in the associated bin's error-handling operations based on the error-handling operations of the closest adjacent bin. Using FIG. 3 for reference, an adjacent bin is the bin immediately before or immediately after a bin (e.g., bins 0 and 2 are adjacent bins to bin 1, bins 4 and 6 are adjacent bins to bin 5, etc.). In an illustrative example, the error-handling flow management component 113 can determine, based on the TAP values of said block(s) (or block family), that one or more blocks in a block family associated with bin 5 are closer to bin 4 than to bin 6. The error-handling flow management component 113 can then adjust the read offsets used in the error-handling operations associated with bin 5 to the read offsets used in the error handling operations associated with bin 4.

In some embodiment, the error-handling flow management component 113 can configure the order of error-hand operations in an error-handling flow based on the bin and the program-erase cycles associated with one or more blocks in a block family associated with the bin. In particular, an older bin is one where the read levels are directed at data with a relatively large TAP. Blocks in older bins with relatively high program-erase cycles may have relatively large voltage shifts and relatively narrow distribution valleys. As such, deep error handling techniques may have a relatively greater chance of achieving date recover than error-handling operations involving read level adjustments. Accordingly, the error-handling flow management component 113 can dynamically adjust the order of the error-handling operations of the error-handling flow based on bin (e.g., the bin number) and the program-erase cycles of one or more blocks in the block family exceeding a threshold criterion. By way of illustrative example only, responsive to 10 or more blocks in bin 6 or higher having at least 1000 program-erase cycles, the error-handling flow management component 113 can dynamically adjust the error-handling flow to begin with deep error handling techniques.

In some embodiments, the error-handling flow management component 113 can implement a closed feedback loop to determine which modifications are successful in recovering data. Based on the feedback, the error-handling flow management component 113 can update the error-handling flow. In particular, the error-handling flow management component 113 can track the success rate of data recovery for each error-handling operation in the error-handling flow. The error-handling flow management component 113 can then compare the success rate of each of the error-handling operations to each other. Based on the comparison (e.g., which error-handling operation has the higher success rate), the error-handling flow management component 113 can reorder the error handling operations in the error handling flow (e.g., the error-handling operation with the highest success rate can be performed first, the error-handling operation with the next highest success rate can be performed second, etc.). The error-handling flow management component 113 can track the success rate of each error-handling operation for each bin using a table (e.g., a metadata table), a log, etc.)

In an example, in response to the error-handling flow management component 113 determining that the subsequent error-handling operation of the error-handling flow has a higher success rate of successfully recovering data than the preceding error-handling operation of the error-handling flow, the error-handling flow management component 113 can adjust the error-handling flow to begin with the second error-handling operation rather than the first error-handling operation. The error-handling flow management component 113 can continuously implement the closed feedback loop during the lifetime of the memory sub-system 110.

Some error-handling operations can have a high success rate, but also a high latency. For example, deep-error-handling techniques, such as HARQ operations, can have a high success rate in recovering data, but also a higher latency relative to, for example, read offset operations. As such, in some embodiments, the error-handling flow management component 113 can track latency data for each error-handling operations, and reorder the error-handling operations in the error handling flow as a function of the latency data of each error-handling operation and/or the success rate of each error-handling operation. The latency data can be stored in a data table or library of memory sub-system 110, and can be determined and set during manufacturing of memory sub-system 110 or during programming and/or calibration of memory sub-system 110. In some embodiments, error-handling flow management component 113 can reorder the error-handling operations based on the latency data and success rate data. In some embodiments, error-handling flow management component 113 can use a set of rules that involve assigning a weight and numerical value between 0 and 1 for the latency data and the success rate data of each error-handling operation in the error-handling flow, and combining the weighted data to generate a position value for each error-handling operation. Error-handling flow management component 113 can order the error-handling operations based on their respective position values. Different scales and any score values can be used with each error-handling operation to determine each position value. In other embodiments, error-handling flow management component 113 can use a machine learning approach, a statistics based approach, or any other approach to order the error-handling operations of an error-handling flow as a function of success rate data and latency data.

Figure 5:
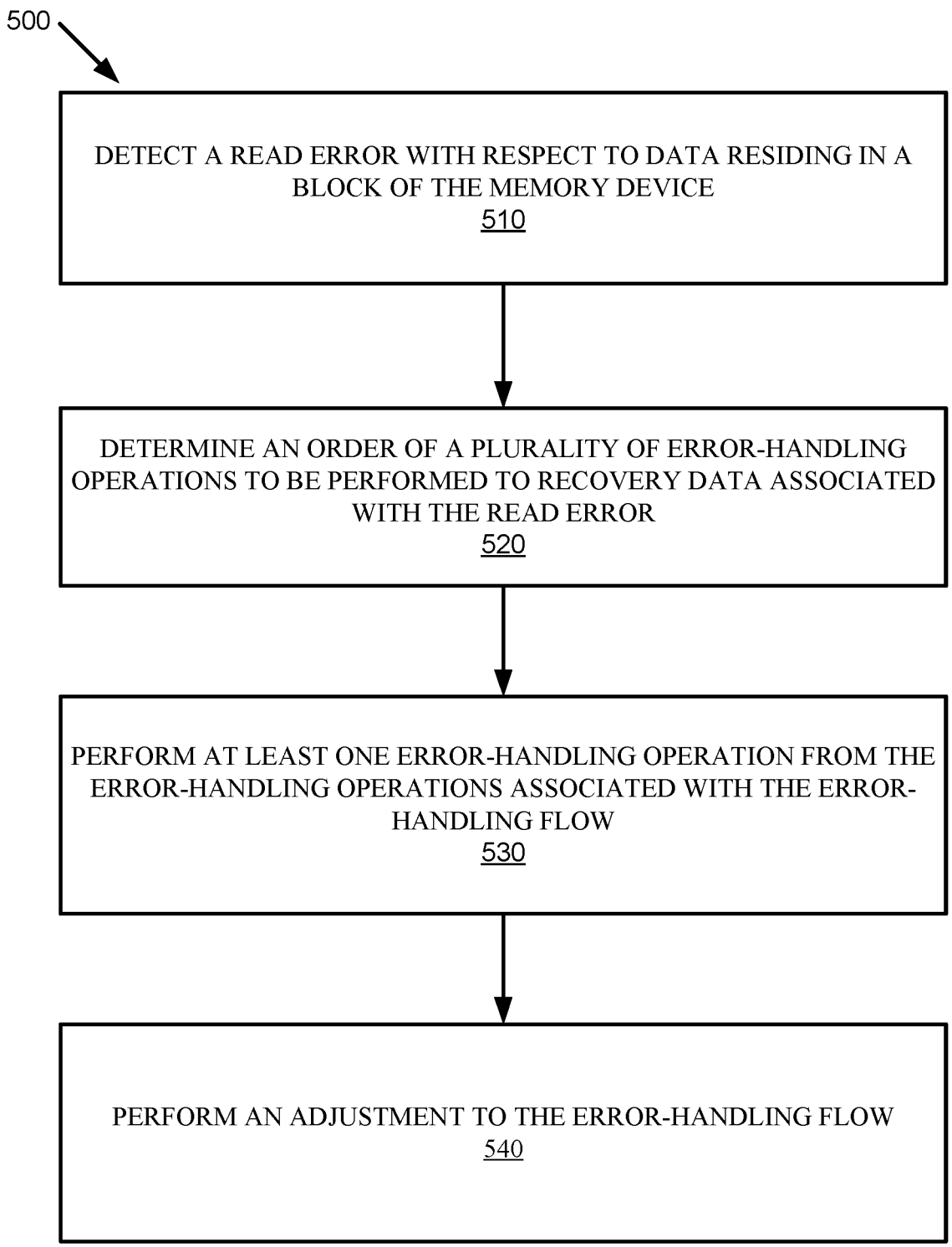
FIG. 5 is a flow diagram of an example method of performing error-handling flow management, in accordance with some embodiments of the present disclosure.

FIG. 5 is a flow diagram of an example method 500 of error-handling flow management implemented by a memory sub-system controller operating in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the error-handling flow management component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 510, the processing logic detects a read error with respect to data residing in a block of the memory device. In some embodiments, the block can be part of a block family associated with a voltage offset bin.

At operation 520, the processing logic determines an order of error-handling operations to be performed to recovery data associated with the read error. For example, the processing logic can use a metadata table (e.g., metadata table 410 and/or 420) to determine which error-handling flow is associated with the voltage offset bin, and the order of the error-handling operations (along with their parameters) specified by the error-handling flow.

At operation 530, the processing logic performs at least one error-handling operation from with the error-handling flow. For example, the processing logic can execute the first error-handling operation(s) of the error-handling flow. In response to the error-handling operation(s) failing to recover the data, the processing logic can execute the second error-handling operation(s) of the error-handling flow, and so on.

At operation 540, the processing logic can perform an adjustment to the error-handling flow. For example, the adjustment can be in response to one or more error-handling operation from with the error-handling flow failing to recover the data, a threshold criterion being satisfied, etc. In some embodiments, the processing logic can adjust an order of the error-handling operations in the error-handling flow. For example, the order can be adjusted based on a number of program-erase operations performed on the block exceeding a predetermined criterion, based on a success rate and/or latency data of an error-handling operation recovering the data, etc. In some embodiments, the processing logic can maintain a record of read error rates for the voltage offset bin and, responsive to detecting the read error rates satisfying a threshold criterion, the processing logic can adjust a read voltage offset associated with an error-handling operation. In some embodiments, the processing logic can determine a proximity of a TAP value of the block to a TAP value of an adjacent voltage offset bin, and adjust a read voltage offset based on the error handling flow associated with the adjacent voltage offset bin. In some embodiments, the processing logic can perform a calibration procedure (e.g. cRLC) to determine a bin association of the block and increase a number of page samples associated with the calibration procedure. In some embodiments, the processing logic can determine the number of program-erase cycles associated with the block and, responsive to determining that the number of program-erase cycles exceeds a predetermined threshold value, adjust the order of the error-handling operations in the error-handling flow or adjust a read voltage adjustment associated with one or more error-handling operations. In some embodiments, the processing logic can update the order of the error-handling operations based on which error-handling operation recovers the data.

Figure 6:
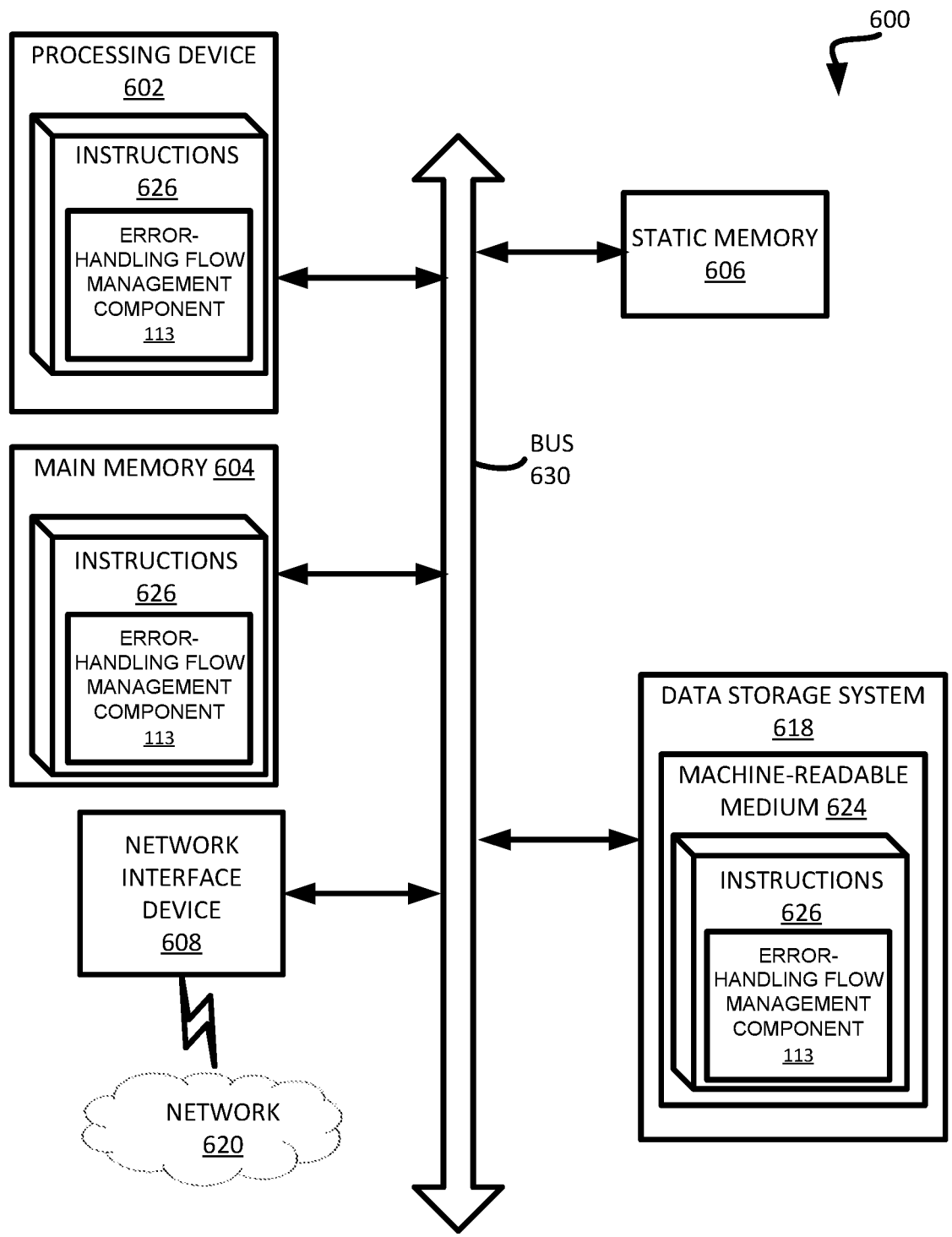
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes or utilizes a memory sub-system (e.g., the memory sub-system 110 of FIG. 1) or can be used to perform the operations of a controller (e.g., to execute an operating system to perform operations corresponding to error-handling flow management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630. Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to error-handling flow management component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising:
   selecting, from a plurality of voltage offset bins, a voltage offset bin associated with a block of the memory device, wherein each voltage offset bin corresponds to a respective predetermined range of threshold voltage offsets to be applied to a base voltage read level during read operations;
   performing, on data residing in the block, an error-handling operation of a plurality of error-handling operations, wherein an order of the plurality of error-handling operations is based on the voltage offset bin associated with the block; and
   responsive to determining that the error-handling operation has failed to recover the data, adjusting the order of the plurality of error-handling operations.

2. The system of claim 1, wherein the operations further comprise:
maintaining a record of read error rates for the voltage offset bin; and
responsive to detecting the read error rates satisfying a threshold criterion, adjusting a read voltage offset associated with at least one error-handling operation.

3. The system of claim 1, wherein the operations further comprise:
determining a proximity of a time after program (TAP) value of the block to a TAP value of an adjacent voltage offset bin; and
adjusting a read voltage offset based on an error-handling flow associated with the adjacent voltage offset bin.

4. The system of claim 1, wherein the operations further comprise:
performing a calibration procedure to determine a bin association of the block; and
increasing a number of page samples associated with the calibration procedure.

5. The system of claim 1, wherein the operations further comprise:
determining a number of program-erase cycles associated with the block, and
responsive to determining that the number of program-erase cycles exceeds a predetermined threshold, adjusting at least one of the order of the plurality of error-handling operations or a read voltage adjustment associated with one of the error-handling operations.

6. The system of claim 1, wherein the operations further comprise:
updating the order of the plurality of error-handling operations based on which error-handling operation of the plurality of error-handling operations recovers the data.

7. The system of claim 1, wherein the operations further comprise:
updating the order of the plurality of error-handling operations based on latency data associated with each of the plurality of error-handling operations.

8. A method, comprising:
selecting, from a plurality of voltage offset bins, a voltage offset bin associated with a block of a memory device, wherein each voltage offset bin corresponds to a respective predetermined range of threshold voltage offsets to be applied to a base voltage read level during read operations;
performing, on data residing in the block, an error-handling operation of a plurality of error-handling operations, wherein an order of the plurality of error-handling operations is based on the voltage offset bin associated with the block; and
responsive to determining that the error-handling operation has failed to recover the data, adjusting the order of the plurality of error-handling operations.

9. The method of claim 8, further comprising:
maintaining a record of read error rates for the voltage offset bin; and
responsive to detecting the read error rates satisfying a threshold criterion, adjusting a read voltage offset associated with at least one error-handling operation.

10. The method of claim 8, further comprising:
determining a proximity of a time after program (TAP) value of the block to a TAP value of an adjacent voltage offset bin; and
adjusting a read voltage offset based on an error-handling flow associated with the adjacent voltage offset bin.

11. The method of claim 8, further comprising:
performing a calibration procedure to determine a bin association of the block; and
increasing a number of page samples associated with the calibration procedure.

12. The method of claim 8, further comprising:
determining a number of program-erase cycles associated with the block, and
responsive to determining that the number of program-erase cycles exceeds a predetermined threshold, adjusting at least one of the order of the plurality of error-handling operations or a read voltage adjustment associated with one of the error-handling operations.

13. The method of claim 8, further comprising:
updating the order of the plurality of error-handling operations based on which error-handling operation of the plurality of error-handling operations recovers the data.

14. The method of claim 8, further comprising:
updating the order of the plurality of error-handling operations based on latency data associated with each of the plurality of error-handling operations.

15. A non-transitory computer-readable storage medium comprising instructions that, when executed by a processing device operatively coupled to a memory, performs operations comprising:
selecting, from a plurality of voltage offset bins, a voltage offset bin associated with a block of a memory device, wherein each voltage offset bin corresponds to a respective predetermined range of threshold voltage offsets to be applied to a base voltage read level during read operations;
performing, on data residing in the block, an error-handling operation of a plurality of error-handling operations, wherein an order of the plurality of error-handling operations is based on the voltage offset bin associated with the block; and
responsive to determining that the error-handling operation has failed to recover the data, adjusting the order of the plurality of error-handling operations.

16. The non-transitory computer-readable storage medium of claim 15, wherein the operations further comprise:
maintaining a record of read error rates for the voltage offset bin; and
responsive to detecting the read error rates satisfying a threshold criterion, adjusting a read voltage offset associated with at least one error-handling operation.

17. The non-transitory computer-readable storage medium of claim 15, wherein the operations further comprise:
determining a proximity of a time after program (TAP) value of the block to a TAP value of an adjacent voltage offset bin; and
adjusting a read voltage offset based on an error-handling flow associated with the adjacent voltage offset bin.

18. The non-transitory computer-readable storage medium of claim 15, wherein the operations further comprise:
performing a calibration procedure to determine a bin association of the block; and
increasing a number of page samples associated with the calibration procedure.

19. The non-transitory computer-readable storage medium of claim 15, wherein the operations further comprise:
determining a number of program-erase cycles associated with the block, and
responsive to determining that the number of program-erase cycles exceeds a predetermined threshold, adjusting at least one of the order of the plurality of error-handling operations or a read voltage adjustment associated with one of the error-handling operations.

20. The non-transitory computer-readable storage medium of claim 15, wherein the operations further comprise:
updating the order of the plurality of error-handling operations based on which error-handling operation of the plurality of error-handling operations recovers the data.

* * * * *